United States Patent [19]

Ohki et al.

[11] Patent Number: 4,458,980
[45] Date of Patent: Jul. 10, 1984

[54] OPTICAL REPRODUCING HEAD

[75] Inventors: Hiroshi Ohki; Chiaki Kojima, both of Kanagawa, Japan

[73] Assignee: Sony Corporation, Tokyo, Japan

[21] Appl. No.: 189,577

[22] Filed: Sep. 23, 1980

[30] Foreign Application Priority Data

Sep. 25, 1979 [JP] Japan .................. 54-123047

[51] Int. Cl.³ ........................... G02B 5/32
[52] U.S. Cl. .................... 350/3.73; 369/103
[58] Field of Search .............. 350/3.7, 3.72, 3.73, 350/3.71, 3.78, 3.79; 369/103

[56] References Cited

U.S. PATENT DOCUMENTS

| | | | |
|---|---|---|---|
| 4,245,882 | 1/1981 | Chang | 350/3.72 |
| 4,253,723 | 3/1981 | Kojima et al. | 350/3.72 |
| 4,312,559 | 1/1982 | Kojima et al. | 350/3.72 |
| 4,355,858 | 10/1982 | Funato et al. | 350/3.72 |

OTHER PUBLICATIONS

Sincerbox, G. T., "Formation of Optical Elements by Holography", IBM Tech. Disclosure Bulletin, vol. 10, No. 3, Aug. 1967, pp. 2 and 3.
Richtev, A. K. et al., "Holographically Generated Lens", Applied Optics, vol. 13, No. 12, Dec. 1974, pp. 2924-2930.

Primary Examiner—Bruce Y. Arnold
Attorney, Agent, or Firm—Lewis H. Eslinger; Alvin Sinderbrand

[57] ABSTRACT

An optical reproducing head for reproducing an information signal recorded on an optical record medium includes a semiconductor laser for generating a laser beam, a first off-axis hologram lens irradiated with the laser beam from the semiconductor laser to produce a beam of parallel rays of light that has an optical axis which is off-set with respect to the optical axis of the laser beam, a second off-axis hologram lens irradiated with the beam of parallel rays of light from the first off-axis hologram lens to generate a focused beam which has an optical axis which is off-set with respect to the optical axis of the beam of parallel rays of light and has an optical axis perpendicular to the optical record medium, and a photo-detector detecting the intensity of a non-diffracted wave beam from the first off-axis hologram lens means, the non-diffracted wave beam being at least part of the focused beam which has been reflected from the optical record medium and has been diffracted by the second off-axis hologram lens. The output of the photodetector is used to produce a focus error signal and a tracking error signal for controlling the focus servo and tracking servo operations.

2 Claims, 15 Drawing Figures

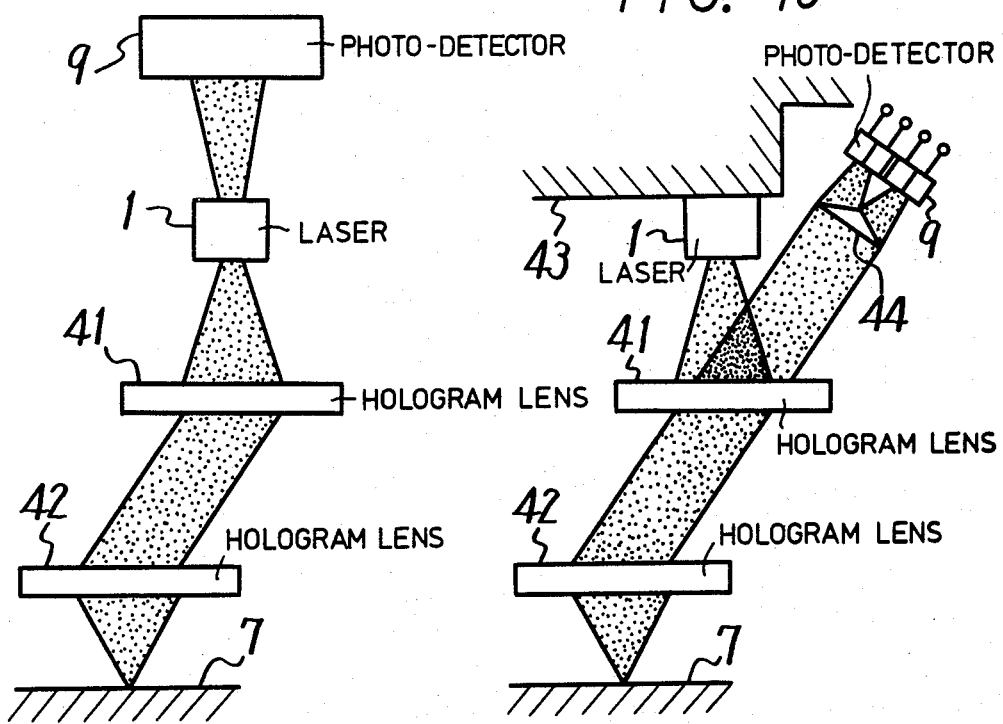
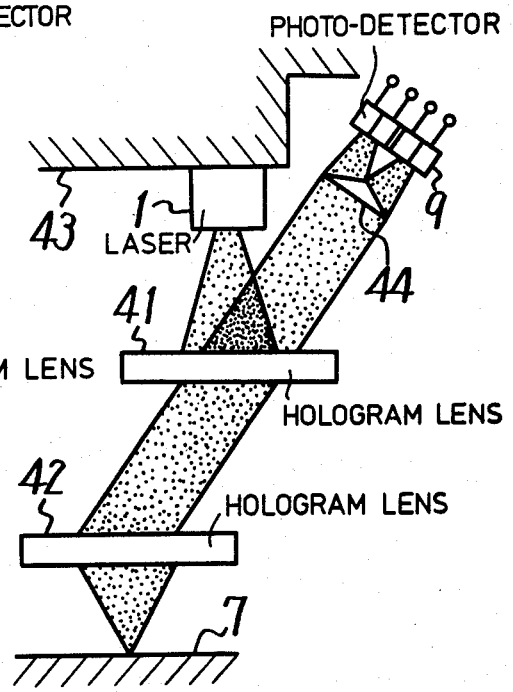
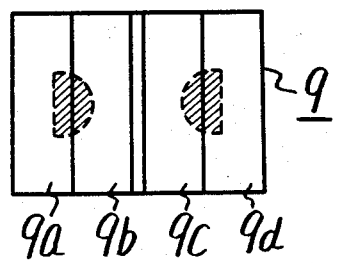
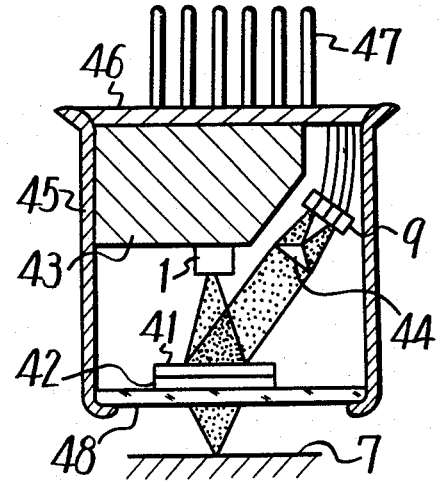

OPTICAL REPRODUCING HEAD

BACKGROUND OF THE INVENTION

1. Field of the Invention

The present invention relates generally to an optical reproducing head and, more particularly, is directed to an optical reproducing head of the type using a semiconductor laser source.

2. Description of Prior Art

There has been proposed an optical reproducing head according to the prior art using a semiconductor laser source which will now be described with reference to FIG. 1.

In FIG. 1, the semiconductor laser source 1 is formed of a semiconductor of the double hetero junction type, for example, of GaAlAs (gallium-aluminum arsenide). Laser source 1 is adapted to emit a laser beam having a cross-sectional shape at its emitting position of an elongated rectangle with approximate dimensions of 0.5 $\mu m \times 5$ to 10 $\mu m$. The laser beam emitted from laser source 1 is a diverging beam having anisotropic diverging angles and which forms an angle of about 30° at the long side of the above cross-sectional shape with respect to the peripheral surface of a beam parallel to each long side, and about 4° at the short side thereof with respect to the peripheral surface of a beam parallel to each short side, respectively. However, respective diverging angles of opposite peripheral surfaces of the beam are symmetrically arranged with respect to each other.

The diverging beam (linearly polarized laser beam) from laser source 1 falls on collimator lens 2 where it is converted into a beam of substantially parallel rays of light (a substantially plane wave beam) before falling on a cylindrical lens 3 (actually consisting of two lenses). At lens 3, the anisotropy of the beam converging angles is corrected and the collimated beam strikes a polarized beam splitter 4. Then, the linearly polarized laser beam from beam splitter 4 impinges on a $\lambda/4$ plate 5 where it is then converted into a circularly polarized laser beam, which then falls on an objective lens 6. The beam passed through lens 6 is converted into a focused beam having a substantially circular cross-sectional shape, and is thus finally focused on an optical record medium 7 so as to form a spot having a diameter of substantially one $\mu m$ or less.

On optical record medium 7, a pulse-code-modulated (PCM) information signal, such as a video signal, an audio signal or the like, is recorded as a train of bits on a track of a spiral form. A reflected beam from record medium 7 passes through objective lens 6 to strike $\lambda/4$ plate 5 and is thereby converted from a circularly polarized beam back to a linearly polarized beam (that is, the incident beam and polarization surface of $\lambda/4$ plate 5 meet each other at right angles). The converted beam from $\lambda/4$ plate 5 is reflected by beam splitter 4 to strike a cylindrical lens 8 and then falls on a photo-detector 9 (such as a PIN diode) to derive therefrom a reproduced output.

The photo-detector 9 consists of four rectangular photo-detecting elements which have the same dimensions. A spot of the incident beam supplied to photo-detector 9 is varied in shape from an ellipse through a true or perfect circle to another ellipse (whose long diameter intersects at right angles with the long diameter of the former ellipse) by operation of cylindrical lens 8 in accordance with the focusing state of incident light supplied to optical record medium 7. By utilizing the difference between the sum of reproduced signals at two opposing photo-detecting elements arranged on one diagonal line of detector 9 and the sum of reproduced signals at two opposing photo-detecting elements arranged on the other diagonal line, a focus error signal can be provided. This focus error signal is adapted to control apparatus for moving objective lens 6, or the whole optical system, in the direction of the optical axis of light impinging on record medium 7 so that the focus servo operation can be performed.

By utilizing the difference between the sum of reproduced signals at two photo-detecting elements of the right side and the sum of reproduced signals at those of the left side, a tracking error signal can also be provided. This tracking error signal is adapted to control apparatus for moving objective lens 6, or the whole optical system, in a direction perpendicular to the track on the record medium so that the center position of the beam can be controlled to accurately move on or follow the track.

In place of cylindrical lens 8, a wedge can be provided to separate the beam emitted from beam splitter 4 into two parts and the separated beams are then irradiated to photo-detector 9. In this case, the above separating angle is varied according to the focusing state of the incident beam on optical record medium 7, so that the two parts may be utilized to provide the focus error signal from photo-detector 9 in the same manner as described above.

When a semiconductor which produces anisotropic diverging angles which are small is employed as semiconductor laser source 1, cylindrical lens 3 can be omitted. However, such a laser source will seldom be used since its laser beam output is not sufficiently large.

However, the prior art optical reproducing head described above has many drawbacks. In particular, since the lenses used for collimator lens 2 and objective lens 6 are similar to the objective lenses of a microscope, the lenses are relatively heavy, for example, weighing as much as 8 to 10 grams. In addition, the optical system is of a relatively large size as a whole since the number of components used is large and therefore, the optical system occupies a large space. The fabrication and adjustment of the optical system are also troublesome, in that various components of the system begin to warp with the passage of time resulting in further cost increases. Further, when the optical system is moved up and down in a focus servo mode or vibrated right and left (wobbling) in a tracking servo mode, the driving device used for moving the system in the above modes is large. This results in the power consumption therefor being increased and the upper limit of the frequency range in the above vibration mode being lowered.

Another prior art optical reproducing head using a semiconductor laser source will now be described with reference to FIG. 2, in which elements corresponding to those described above with reference to the system of FIG. 1 are identified by the same reference numerals and with a detailed description thereof being omitted. In the system of FIG. 2, photo-detector 9 is arranged at one side of collimator lens 2 with semiconductor laser source 1 being interposed therebetween. A reproduced or reflected beam from record medium 7 is transmitted back through the path of objective lens 6, cylindrical lens 3, collimator lens 2, to semiconductor laser source 1, wherein the strength of the oscillating beam thereof is modulated according to the level of the returned beam. Thus, the strength of the beam radiated back from laser source 1 is detected and a corresponding signal is reproduced by photo-detector 9.

It should be appreciated that the optical reproducing head of FIG. 2 is of a slightly simpler construction in comparison with the optical reproducing head of FIG. 1. However, in order to perform respective servo actions by the focus and tracking error signals, the optical system must be subjected to a wobbling motion, and driving means for such motion is required. This results in a rather complicated construction, and whereby the stability in the servo mode is not very good.

The Applicants herein have proposed another optical reproducing head using a semiconductor laser source in which a hologram lens is used in the optical system, as shown in FIG. 3. With this optical reproducing head, a hologram lens 10 is provided in place of collimator lens 2, cylindrical lens 3 (which is sometimes not used), and objective lens 6 used in the example of FIG. 2, to achieve the latter's optical functions. When hologram lens 10 is irradiated with a laser beam from semiconductor laser source 1 which is similar to that of FIG. 2, a focused beam identical to that from objective lens 6 of FIG. 2 is obtained from the hologram lens 10. The remaining operation is also similar to the embodiment of FIG. 2.

Referring to FIG. 4, a description will now be given of a method of producing hologram lens 10. In FIG. 4, a hologram record medium 10' of hologram lens 10 is provided and a photo-sensitive layer (not shown) with gelatin as its base material is coated on a glass plate of record medium 10'. A photographic interference image or pattern, as will be described later, is formed on the photo-sensitive layer, and the treated photo-sensitive layer is developed to produce hologram lens 10.

In particular, a hologram lens 11 (in this case, an off-axis hologram lens) is provided as an objective lens for producing hologram lens 10. In other words, off-axis hologram lens 11 is disposed parallel to and opposite to record medium 10' with a predetermined distance therebetween. In front of hologram lens 11 is disposed a mask 12 which consists of a light transmitting portion 12a provided at its center and a light intercepting portion 12b occupying the remaining area other than the former portion, as shown in FIG. 5. For example, a metal coating such as chrome or nickel is selectively formed by deposition on a glass base plate to produce mask 12. The light transmitting portion 12a is made substantially coincident with the amplitude transmission factor of the emitting portion of a laser beam from the semiconductor laser source to be used, that is, the dimensions thereof are made substantially coincident with the cross-sectional configuration (and dimensions, of course) of the above emitting portion. In this example, light transmitting portion 12a corresponds to the shape of the laser beam from semiconductor laser source 1 previously described in FIG. 1.

A laser beam from a common laser source (not shown) is partially passed through a beam splitter 13 and falls on a beam expander 14 where the beam has its width expanded. In this case, it is preferable that the common laser source generates a laser beam having the same wavelength as the laser beam from the semiconductor laser source to be used. The expanded beam from beam expander 14 is reflected by a mirror 15 and the reflected beam therefrom falls on the off-axis hologram lens 11 at an incident angle of, for example, 45°, as a reproduction reference wave beam 16 (a plane wave beam or similar spherical wave beam). A focused subject wave beam 17 (a spherical wave beam), which is focused to a point P is thus produced by hologram lens 11 in response to reference wave beam 16. The subject wave beam 17 is irradiated onto record medium 10' in front of point P as a focused record beam (a spherical wave beam) with its optical axis perpendicular to record medium 10'.

At the same time, the other portion of the laser beam from the aforesaid common laser source is reflected from beam splitter 13 and further reflected by a mirror 18. The reflected beam from mirror 18 is passed through an auxiliary lens 19 where the beam has its width contracted and which is then reflected by a mirror 20. This latter reflected beam from mirror 20 is passed through light transmitting portion 12a of mask 12 to form a diverging beam 21 (a spherical wave beam). This diverging beam 21 has a cross-sectional shape and a diverging angle corresponding to those of the laser beam emitted from the semiconductor laser source to be used. The beam 21 is irradiated on record medium 10' as a diverging record beam with its optical axis perpendicular to record medium 10'.

Thus, an interference pattern between beams 17 and 21 is recorded on record medium 10' with both beams having optical axes perpendicular to record medium 10', that is, being in an inline relation relative to each other. The record medium 10' is then developed to obtain hologram lens 10 having the functions of the optical system in FIG. 2, that is, of collimator lens 2, cylindrical lens 3, and objective lens 6. In this case, the distance between record medium 10' and hologram lens 11 is selected so as to have a maximum overlapping portion of beams 17 and 21 on record medium 10'.

The mask 12, however, may be a hindrance to reproduction of reference wave beam 16. However, if mask 12 is made very small in comparison with the area of hologram lens 11 or is attached to the rear surface of hologram lens 11 (the surface thereof in opposition to record medium 10'), any influence of mask 12 in the formation of subject wave beam 17 will be reduced.

The off-axis hologram lens 11 serving as the objective lens in the embodiment of FIG. 4 is produced in the following manner. As shown in FIG. 6, a record reference wave beam 23 (a plane wave beam or similar spherical wave beam) is irradiated on a hologram record medium 11' at an incident angle of 45° from the common laser source (not shown), which is desirably the same source as previously mentioned in regard to FIG. 4. At the same time, the laser beam from the same laser source falls on an objective lens 24 (similar to that of a microscope which focuses it at a point Q and a diverging record subject wave beam 25 (a spherical wave beam) thereafter is irradiated onto record medium 11' with its optical axis perpendicular thereto so as to form an interference pattern with reference wave beam 23. Thus, processed record medium 11' is developed and off-axis hologram lens 11 is finally obtained therefrom.

In addition to the above embodiment using off-axis hologram lens 11 of FIG. 4 as the objective lens, an embodiment using an inline hologram lens will now be described with reference to FIG. 7. A laser beam from the common laser source (similar to that of FIG. 4, although not shown) is partially passed through a beam splitter 27 to form a reproduction reference wave beam 28 (a plane wave beam or similar spherical wave beam), which falls vertically on an inline hologram lens 11 to produce a reproduction subject wave beam 17 (a spherical wave beam) which is focused at the point P. This subject wave beam 17 is irradiated onto hologram record medium 10' as a focused record beam. Meanwhile, the other part of the laser beam from the same laser source is reflected by mirror 18, contracted in width at auxiliary lens 19, reflected again at beam splitter 27, and then passed through light transmitting portion 12a of mask 12 to obtain the diverging record beam 21 (spherical wave beam). This diverging beam 21 is irradiated onto record medium 10' with its optical axis coincident with a normal of record medium 10', that is, perpendicular to record medium 10'. Thus, an interference pattern between beams 17 and 21 is formed on record medium 10' and record medium 10' is developed to obtain hologram lens 10, as previously discussed. In this case, the hologram lens 11 has a low diffraction efficiency and interference stripes at its center are rough so that it is difficult to produce Bragg diffraction. As a result, it is unnecessary to further consider the influence of mask 12 other than in the embodiment of FIG. 4.

The production of inline hologram lens 11 as the objective lens of FIG. 7 will now be discussed in regard to FIG. 8. In particular, an off-axis hologram lens 30 is provided as an objective lens. The laser beam from the laser source (similar to that of FIG. 4, although not shown) is partially passed through the hologram lens 30 and is irradiated vertically onto a hologram record medium 11' as a reproduction reference wave beam 31 (a plane wave beam or similar spherical wave beam). The other part of the laser beam from the same laser source is rendered to fall on hologram lens 30 at an incident angle of 45° as a reproduction reference wave beam 33 (a plane wave beam or similar spherical wave beam) to derive therefrom a diverging reproduction subject wave beam 32 (a spherical wave beam) which diverges after being focused at the point Q. This subject wave beam 32 is irradiated onto record medium 11' with its optical axis perpendicular thereto. Thus, an interference pattern between beams 31 and 32 is formed on record medium 11' which is then developed to obtain inline hologram lens 11.

The optical reproducing heads above described with reference to FIG. 3 through FIG. 8 have various advantages, for example, they are of a small size, are lightweight, use only a few components, are easy to produce and adjust, produce very little warp with the passage of time, and are inexpensive. In addition, when the tracking servo or focus servo operations are carried out, the driving means therefor can also be made in a relatively small size, the power consumption therefor can be lowered, and the upper limit of the frequency range in the vibration mode can be improved. However, the hologram lens serving as the objective lens must be produced before the aiming hologram lens is produced, so that the method of production is troublesome.

SUMMARY OF THE INVENTION

Accordingly, it is an object of this invention to provide a novel optical reproducing head that avoids the above-described difficulties encountered with the prior art.

It is another object of this invention to provide an optical reproducing head using an off-axis hologram lens and which can easily be produced.

In accordance with an aspect of this invention, an optical reproducing head includes a semiconductor laser which generates a laser beam, a first off-axis hologram lens receiving the laser beam emitted from the semiconductor laser as a first reference wave beam to produce a beam of parallel rays of light as a first subject wave beam, each of the first reference wave beam and first subject wave beam having an optical axis which is off-set with respect to each other, and a second off-axis hologram lens receiving the beam of parallel rays of light from the first off-axis hologram lens as a second reference wave beam to generate a focused beam as a second subject wave beam, each of the second reference wave beam and second subject wave beam having an optical axis which is off-set with respect to each other. The focused beam from the second off-axis hologram lens is irradiated on an optical record medium with its optical axis perpendicular to the latter.

The optical reproducing head also includes a photodetector which is adapted to detect variations in the level of a beam reflected from the optical record medium and passed through the second and first off-axis hologram lenses.

Further, the first off-axis hologram lens is produced in such a manner that a photo-sensitive layer is simultaneously exposed to a reference wave beam from the semiconductor laser and to a subject wave beam, which is a beam of parallel rays of light having an optical axis which is off-set with respect to the optical axis of the above reference wave beam, so as to form a photographic interference pattern on the photo-sensitive layer. The processed photo-sensitive layer is then developed to form the first off-axis hologram lens.

The above, and other, objects, features and advantages of the present invention will be apparent in the following detailed description of illustrative embodiments of the invention which is to be read in connection with the accompanying drawings.

BRIEF DESCRIPTION OF THE DRAWINGS

FIGS. 9 and 10 are schematic diagrams each showing an embodiment of an optical reproducing lens according to this invention;

FIG. 11 is a plan view of one embodiment of a photodetector used in the optical reproducing head of FIG. 10;

FIGS. 12 and 13 are schematic cross-sectional views, each showing another embodiment of the optical reproducing head according to this invention.

DESCRIPTION OF THE PREFERRED EMBODIMENTS

Figure 1:
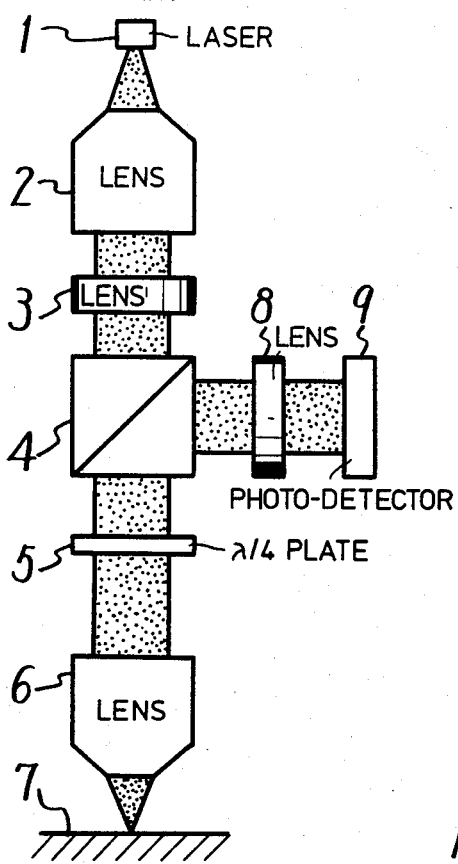
FIGS. 1 and 2 are schematic diagrams, each showing a prior art optical reproducing head.

Referring to the drawings in detail, and initially to FIG. 9 thereof, an embodiment of an optical reproducing head according to this invention will now be described, in which elements corresponding to those described above with reference to the heads of FIGS. 1 to 3 are identified by the same reference numerals and with a detailed description thereof being partially omitted.

Figure 2:
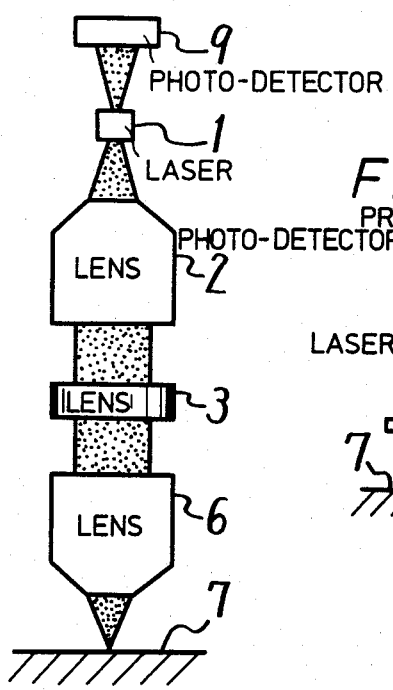
Figure 3:
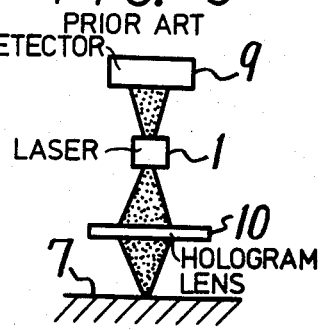
FIG. 3 is a schematic diagram showing an optical reproducing head previously proposed by the Applicants hereof.
Figure 4:
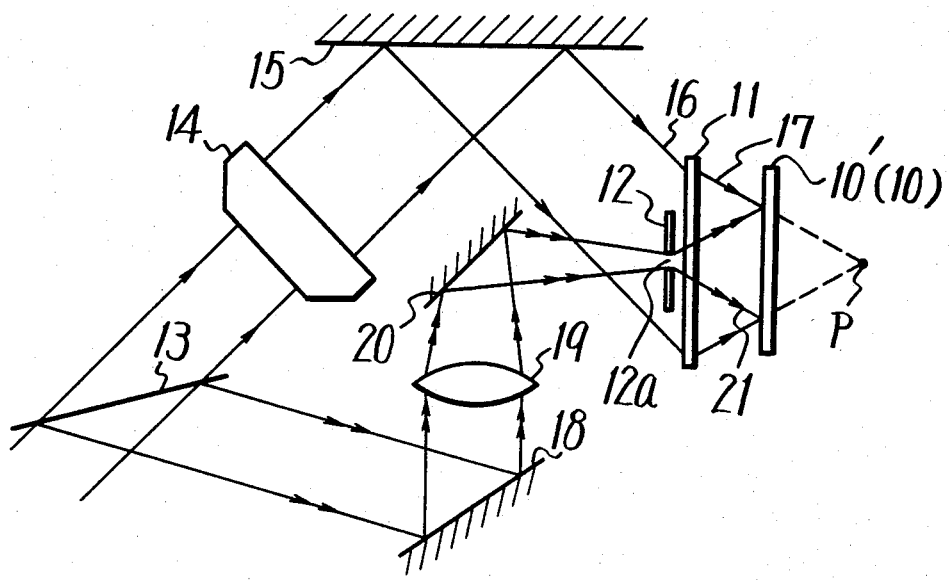
FIG. 4 is a schematic diagram of one embodiment of a method of producing a hologram lens used in the optical reproducing head of FIG. 3.

In this embodiment, a light source to be used is semiconductor laser source 1 which is the same as in the embodiments of the optical reproducing heads of FIGS. 1 and 3. There are also provided a first off-axis hologram lens 41 and a second off-axis hologram lens 42, which are arranged in parallel between laser source 1 and record medium 7 and with a predetermined distance therebetween. A diverging beam emitted from semiconductor laser source 1 falls on first off-axis hologram lens 41 to derive therefrom a beam of parallel rays of light, which is radiated slantwise or at an angle relative to the optical axis of the incident beam. This beam falls at an angle on second off-axis hologram lens 42 to emit therefrom a focused beam (which is similar to the focused beam from objective lens 6 of FIG. 2) having an optical axis substantially perpendicular to hologram lens 42. This focused beam falls on optical record medium 7 to be focused thereon.

The photo-detector 9, which may be a PIN diode, is provided at a side of first off-axis hologram lens 41 with laser source 1 being interposed therebetween. A reproduced beam, that is, a diffracted beam, from record medium 7 is passed back through second off-axis hologram lens 42 and first off-axis hologram lens 41 and returned to laser source 1 to change the strength of its oscillating beam according to the level of the returned beam. The strength variation of the oscillating beam is detected by photo-detector 9 and a reproduced signal is obtained therefrom.

In this case, the whole apparatus is adapted to wobble up and down with respect to record medium 7 to obtain a focus error signal from photo-detector 9 and to wobble in a direction intersecting with the record track at right angles thereto to obtain a tracking error signal from photo-detector 9.

Referring now to FIG. 10, another embodiment of this invention will now be described, in which elements corresponding to those described above with reference to the optical reproducing head of FIG. 9 are identified by the same reference numerals and with repeated description thereof being omitted. In this embodiment, a beam reproduced from record medium 7 impinges on second off-axis hologram lens 42 to emit a beam of parallel light rays, at an angle, which passes without change through first off-axis hologram lens 41. The beam (zero-diffraction beam) therefrom, at the same angle, passes through a wedge 44 and falls on photo-detector 9 where the beam is detected and respective signals are reproduced therefrom. This wedge 44 is adapted to introduce an astigmatism on the optical axis of the beam from second off-axis hologram lens 42. In this regard, the returned beam from first hologram lens 41 also falls on laser source 1 as in the embodiment of FIG. 9. The laser source 1 can be mounted on a heat sink 43 as shown in FIG. 10.

Referring now to FIG. 11, photo-detector 9 is shown to be composed of photo-detecting elements 9a, 9b, 9c and 9d, each being of a rectangular configuration with the same dimensions. Two beams separated by wedge 44 are irradiated near the boundary between photo-detecting elements 9a and 9b and near the boundary between photo-detecting elements 9c and 9d, respectively, as shown in FIGS. 10 and 11. Accordingly, the difference signal between the sum of reproduced outputs of the outer elements 9a and 9d and the sum of reproduced outputs of the inner elements 9b and 9c is used to obtain a focus error signal. Also, the difference signal between the sum of reproduced outputs of elements 9a and 9b on one side of photo-detector 9 and the sum of reproduced outputs of elements 9c and 9d on the other side of photo-detector 9 is used to obtain a tracking error signal. It should therefore be apparent that a reproduced signal corresponding to the record signal on optical record medium 7 in the record tracks thereof can be obtained from the sum of respective reproduced signals from photo-detecting elements 9a to 9d. It should be appreciated, however, that in place of wedge 44, a cylindrical lens can be used.

In the embodiment of FIG. 10, an incident beam supplied to photo-detector 9 will next be discussed. Let it be assumed that the diffraction efficiencies of first and second off-axis hologram lenses 41 and 42 are $\eta_1$ ($<1$) and $\eta_2$ ($<1$), and the reflection factor of record medium 7 at its surface is R ($<1$). If a beam emitted from laser source 1 is assumed to have a value of 1, the incident beam to photo-detector 9 has a diffraction efficiency of $$\eta_1(1-\eta_1)\eta_2^2 R$$

Therefore, it is preferable that $\eta_2$ be selected as a relatively large value, for example, 0.5 or more.

The beams traveling between first and second off-axis hologram lenses in both directions are beams of parallel light rays, as shown in FIGS. 9 and 10, so that first and second off-axis hologram lenses 41 and 42 can overlap each other. One such embodiment of this case will now be described with reference to FIG. 12. The first and second hologram lenses 41 and 42 overlap each other and are mounted on a window glass 48, which is fitted to or closes off one end of a can or jacket 45 (for example, of the type "TO-5" or "TO-3") for use with semiconductor elements. To the other end of can 45 is attached an insulating base plate 46, which has fixed at its inner surface a heat sink 43 and at its outer surface pins 47 in an erected manner. The semiconductor laser source 1 is attached to heat sink 43. The photo-detector 9 and wedge 44 are also installed in can 45 at suitable places in accordance with the above discussion.

When first and second hologram lenses 41 and 42 are disposed in parallel with each other, the parallelism thereof must be limited within a range of ±0.5° provided that each photo-sensitive layer thereof is 5 μm or more thick. However, when both lenses overlap each other, the adjustment of the parallel relationship therebetween is unnecesary and it is only necessary to provide a surface rotation adjustment for positioning the lenses. Further, in the first and second off-axis hologram lenses 41 and 42, when the photo-sensitive layer thereof employs a moisture-sensitive material such as dichromate gelatin as its base material, can 45, window glass 48 and base plate 46 cooperate to make the inner containment area airtight so that first and second off-axis hologram lenses 41 and 42 are protected from moisture.

Accordingly, with the construction shown in FIG. 12, it is possible to provide an optical reproducing head which is of a small size, is lightweight, is structurally strong and produces little warp of the optical system with the passage of time.

Figure 13:
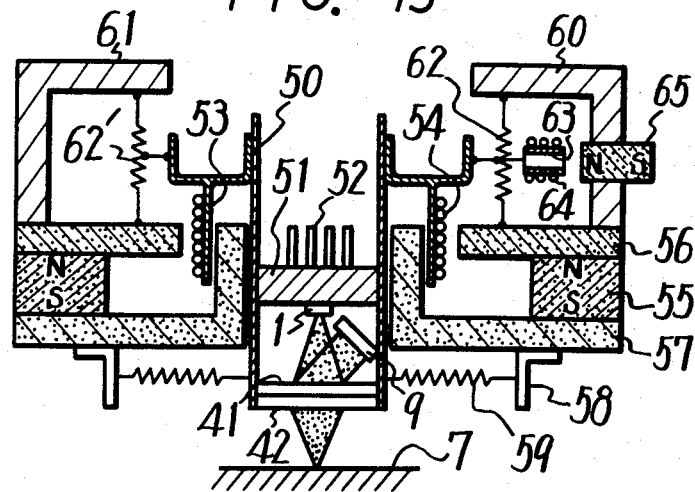

Referring now to FIG. 13, an optical signal reproducing apparatus will now be described in which the focus servo and tracking servo modes are applied in accordance with a reproduced or detected output from the photo-detector and in which the first and second hologram lenses overlap each other. In this embodiment, the first and second off-axis hologram lenses 41 and 42 overlap each other and are attached to the lower end of a cylinder member 50, while a base plate 51 is attached to cylinder member 50 at an intermediate position thereof. On the lower surface of base plate 51 is mounted semiconductor laser source 1 while on the upper surface thereof are erected four pins 52 connected to the output terminals of four elements (refer to FIG. 11) of photo-detector 9. The photo-detector 9 is installed in cylinder member 50 between base plate 51 and first off-axis hologram lens 41. The wedge is omitted in the embodiment of FIG. 13.

A bobbin 53 is attached to the external circumference of cylinder member 50 and a focus servo driving coil 54 is wound about bobbin 53. Outside cylinder member 50 are also disposed yoke members 56 and 57 which are connected to the respective opposite ends of a magnet 55 interposed therebetween. Coil 54 is also interposed between the free ends of yoke members 56 and 57. The magnet 55 and yoke members 56 and 57 may be of an annular form, or may be formed in rod form to provide a plurality of magnets and yoke members. The cylinder member 50 is also coupled to a supporting cylinder 58, which is fixed to yoke member 57, by means of a plurality of springs 59. The springs are spiral springs but can be replaced by a diaphram.

A pair of supporting arms 60 and 61 are fixed to the yoke member 56, and springs 62 and 62' are stretched between each free end of arms 60 and 61, respectively, and yoke member 56. The upper side end portions of bobbin 53 are coupled to respective mid-points of springs 62 and 62' and a bobbin 63 which is wound with a tracking servo driving coil 64 is connected to the mid-point of spring 62 so that coil 64 is disposed opposite to a magnet 65 attached to arm 60.

With the arrangement described above, photo-detector 9 reproduces the recorded signal on the record track of optical record medium 7 and provides the focus error signal and the tracking error signal. The focus error signal is supplied to a focus servo circuit (not shown), the output of which is fed to coil 54 to perform the focus servo operation. Further, the tracking error signal is supplied to a tracking servo circuit (not shown), the output of which is fed to coil 64 to perform the tracking servo operation.

Figure 14:
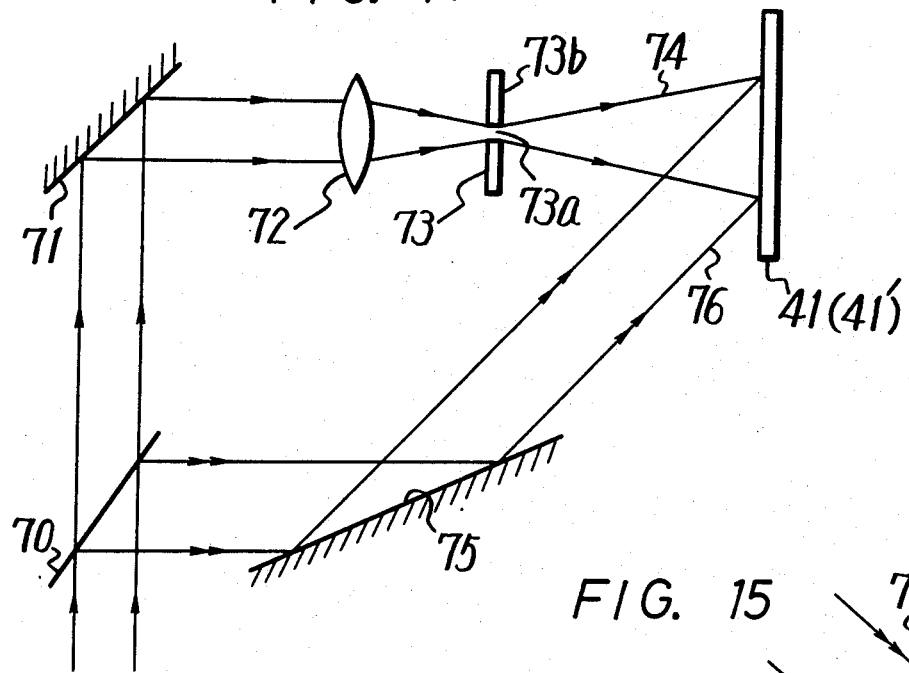
FIGS. 14 and 15 are schematic diagrams showing methods of producing first and second off-axis hologram lenses respectively used in this invention.

Referring now to FIG. 14, a method of producing first off-axis hologram lens 41 will be described. As shown therein, a hologram record medium 41' of hologram lens 41 to be produced is provided and a photo-sensitive layer, mainly formed of gelatin, is coated on a glass base plate (not shown) thereof to produce record medium 41'. An interference pattern is formed on the photo-sensitive layer as will be described hereinafter and such arranged photo-sensitive layer is then developed to obtain first off-axis hologram lens 41.

Although not shown, a common laser source is provided which generates a common laser beam having the same wavelength as that of the laser beam from the semiconductor laser source to be used. A laser beam of parallel rays of light from the above common laser source is separated into two beams by a beam splitter 70. One of the beams passing through beam splitter 70 is reflected at a mirror 71 and this reflected beam of parallel rays of light falls on an auxiliary lens 72, where it is focused and passed through a light transmitting portion 73a of a mask 73 disposed near the mid-position of lens 72. The beam passed through mask 73 is diverging and the diverging beam 74 (spherical wave beam) is irradiated onto hologram record medium 41' with its optical axis perpendicular thereto.

Figure 5:
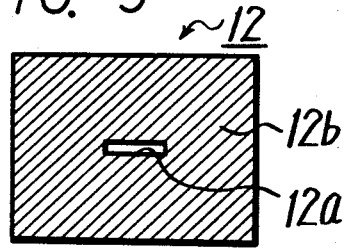
FIG. 5 is a plan view of a mask used in the embodiment of FIG. 4.
Figure 6:
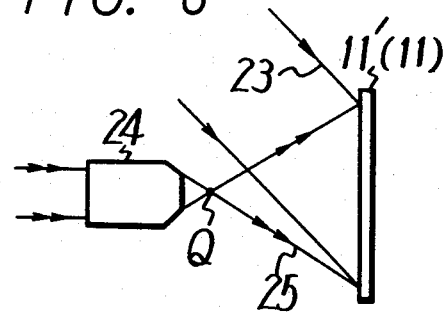
FIG. 6 is a schematic diagram of one embodiment of a method of producing a hologram lens serving as an objective lens which is used in the embodiment of FIG. 4.
Figure 7:
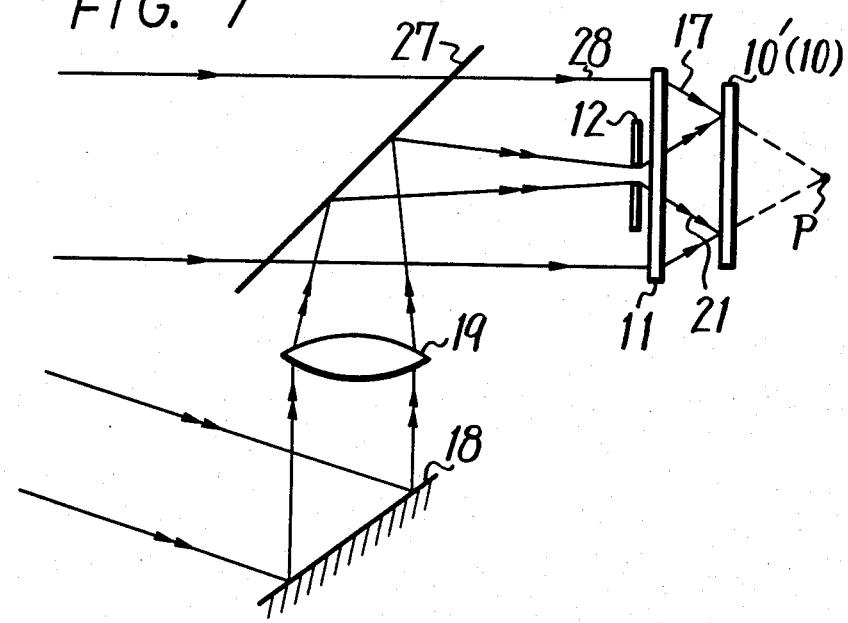
FIG. 7 is a schematic diagram of another embodiment of the method of producing the hologram lens used in the optical reproducing head of FIG. 3.
Figure 8:
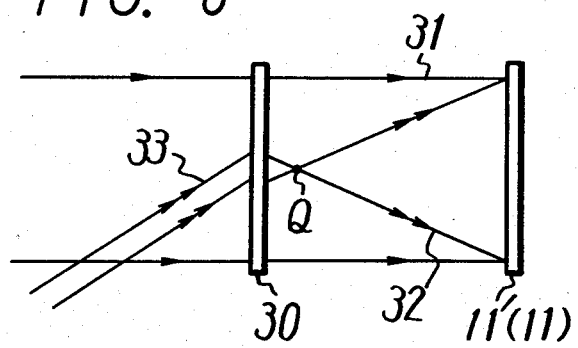
FIG. 8 is a schematic diagram of a method of producing a hologram lens as the objective lens used in the embodiment of FIG. 7.

The mask 73 is composed of a light transmitting portion 73a disposed at its center and a light intercepting portion 73b covering the remaining area except the former light transmitting portion, as in the case of FIG. 5. The mask 73 can be produced, for example, by selective deposition of a metal layer, such as chrome or nickel, on a glass base plate. The light transmitting portion 73a has dimensions substantially equal to the amplitude transmitting factor of the beam projecting section of a laser beam from the semiconductor laser source to be used, that is, the dimensions thereof are made coincident with the cross-sectional configuration and dimensions of the beam projecting section.

The other beam of parallel rays of light separated by splitter 70 is reflected by a mirror 75 and this reflected beam 76 is irradiated slantwise, that is, at an angle, onto hologram record medium 41'. Thus, an interference pattern between diverging beam 74 (spherical wave beam) and beam 76 (plane wave beam) which have the optical axes thereof off-set with respect to each other are recorded on record medium 41', and the processed record medium 41' and the processed record medium 41' is developed to provide first off-axis hologram lens 41.

Figure 15:
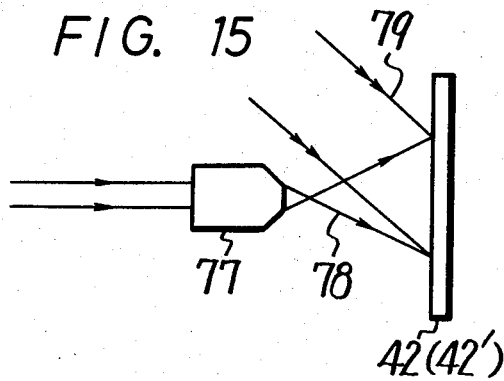

A method of producing second off-axis hologram lens 42 will now be described with reference to FIG. 15, in which a hologram record medium 42' of hologram lens 42 to be produced is provided. Although not shown, a common laser source is provided which is similar to that used in FIG. 14. A laser beam of parallel rays of light from the common laser source falls on an objective lens 77 (similar to the objective lens of a microscope) where it is focused and then diverges thereafter with the diverging beam 78 (spherical wave beam) being irradiated onto hologram record medium 42' with its optical axis perpendicular thereto. At the same time, a laser beam 79 of parallel rays of light (plane wave beam) from the same laser source is irradiated slantwise, that is, at an angle, onto hologram record medium 42'. Thus, an interference pattern resulting from diverging beam 78 (spherical beam) and beam 79 (plane wave beam), both having their optical axis off-set with respect to each other, is recorded on record medium 42', which is then subjected to a developing process to obtain second hologram lens 42.

In producing first and second off-axis hologram lenses 41 and 42, the beams of parallel rays of light falling onto hologram record media 41' and 42' are adapted to have substantially the same incident angle thereto. As a result, the positional adjustment between first and second off-axis hologram lenses 41 and 42 can be easily carried out by shifting these lenses with the parallel arrangement therebetween being maintained. Accordingly, it is also possible to overlap first and second off-axis hologram lenses 41 and 42 with respect to each other.

A description will now be given of one practical example of producing first and second off-axis hologram lenses 41 and 42 and corresponding record media 41' and 42'. A suitable amount of layer hardening agent, such as an aqueous solution of gelatin combined with formaldehyde or glyoxal, is maintained at a temperature of about 40° C., and a glass base plate having a thickness of 1 mm and a spinner are also maintained at a temperature of about 40° C. The aqueous solution of gelatin is then coated on the glass base plate by the spinner with the coating thickness of the coating of aqueous solution of gelatin being selected as 5 m. The aqueous solution of gelatin coated on the glass base plate is then dried to produce a gelatin layer serving as a base material of the photo-sensitive layer.

The photo-sensitivity to a blue or green laser beam is imparted to the gelatin layer by immersing the gelatin in an aqueous solution of 2 to 10 weight % of ammonium bichromate for about 10 minutes, taking it out gradually therefrom, holding it vertically and thereafter drying it in a darkroom.

The photo-sensitivity to a red laser beam is, in like manner, imparted to the gelatin layer by producing an aqueous solution including 2 weight % of ammonium bichromate and $1 \times 3^{-3}$ mol/l of methylene blue coloring agent which is added with ammonium so that its pH is about 10, immersing the gelatin layer in this aqueous solution for about 10 minutes, and then drying it in an atmosphere consisting of ammonia and dry nitrogen.

In this manner, the hologram record medium consisting of the glass base plate and the photo-sensitive layer thereon can be produced. The exposure to the photo-sensitive layer of the hologram record medium is carried out as described above. In this case, the irradiation energy density of the laser beam is about 100 to 1000 mJ/Cm².

The hologram record medium, whose photo-sensitive layer is exposed, is then immersed in water. When the photo-sensitive layer has a photo-sensitivity to a blue or green laser beam, it is immersed in flowing water at a temperature of about 20° C. for about one hour. When the photo-sensitive layer has a photo-sensitivity to a red laser beam, it is immersed in hot water at a temperature of about 40° C. for about 30 minutes. Thereafter, the hologram record medium is immersed in an aqueous solution of 50% isopropanol for about 10 minutes, then dipped into an aqueous solution of 90% isopropanol for several seconds, then immersed in liquid of 100% isopropanol for about 10 minutes, and then rapidly dried by a hot wind to complete the developing process.

The photo-sensitive layer having a base material of a gelatin layer is hygroscopic. Thus, if nothing is done to protect the layer, there may be a problem with dissolution of the hologram lens. To avoid this problem, a cover glass with a thickness of about 150 μm is bonded to the photo-sensitive layer by means of a resin which is hardened by ultraviolet rays. In this manner, first and second off-axis hologram lenses are produced.

In the embodiments shown in FIGS. 9 and 10, an optical recording head can also be constructed by using semi-conductor laser source 1 and first and second off-axis hologram lenses 41 and 42, in which the laser beam of semiconductor laser source 1 is controlled to record information on the optical record medium (mother record medium) by means of a focused beam from second off-axis hologram lens 42. However, a description of such practical construction will not be discussed.

In accordance with the disclosure of the above-mentioned optical reproducing heads according to this invention, since the semiconductor laser source and the hologram lenses are employed in the optical system, the optical system has the advantages that it is of a small size, is lightweight, uses only a few number of components, is easy to produce and adjust, produces very little warp with the passage of time, and is inexpensive. In addition, when the tracking servo or focus servo operations are carried out, the driving means therefor is also of a relatively small size, the power consumption therefor can be lowered, and the upper limit of the frequency range in the vibration mode can be improved. Also, since the optical system uses a first off-axis hologram lens which is supplied with a beam emitted from the semiconductor laser source so as to project a beam of parallel rays of light and a second off-axis hologram lens which is supplied with the beam projected from the first off-axis hologram lens to generate a focused beam which irradiated onto the optical record medium, it is easy to produce and obtain hologram lenses for the optical system according to this invention.

Further, according to this invention, each off-axis hologram lens is used as a hologram lens so that the diffraction efficiency at the center portion is not lower in comparison with an inline hologram lens.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim as our invention:

1. An optical reproducing head for reproducing an information signal recorded on an optical record medium having a reflective layer, comprising:
   semiconductor laser means for radiating a laser beam;
   first off-axis hologram lens means receiving said laser beam radiated from said semiconductor laser means as a first input wave beam for producing a first beam of parallel rays of light as a first output wave beam, each of said first input wave beam and said first output wave beam having an optical axis which is inclined with respect to the other;
   second off-axis hologram lens means receiving said first output wave beam from said first off-axis hologram lens means as a second input wave beam for projecting a focused beam as a second output wave beam onto said optical record medium, each of said second input wave beam and said second output wave beam having an optical axis which is inclined with respect to the other, and said focused beam having an optical axis perpendicular to said optical record medium; and
   photo-detector means for detecting variations in the intensity of a non-diffracted wave beam from said first off-axis hologram lens means, said non-diffracted wave beam being at least a part of the focused beam which has been reflected from said optical record medium and has been diffracted by said second off-axis hologram lens means.

2. An optical reproducing head according to claim 1, further including optical wedge means arranged between said first off-axis hologram lens means and said photodetector means for producing a third output wave beam in response to the beam reflected back through said second and first off-axis hologram lens means, and wherein said photo-detector means produces a focus error signal in response to said third output wave beam.

* * * * *